APPARATUS FOR EFFECTING BONDING OF SEMICONDUCTOR PARTS

Filed March 14, 1966

Inventors:
Charles Fredrick Miller
Raymond O. Zenker
Bobby G. Durant
By Bair, Freeman & Molinare Attys.

Inventors:
Charles Fredrick Miller
Raymond O. Zenker
Bobby G. Durant
By Bair, Freeman & Molinare Attys.

Inventors:
Charles Fredrick Miller
Raymond O. Zenker
Bobby G. Durant
By Bair, Freeman & Molinare Attys.

United States Patent Office 3,451,607
Patented June 24, 1969

3,451,607
APPARATUS FOR EFFECTING BONDING OF SEMICONDUCTOR PARTS

Charles Fredrick Miller, Anaheim, Raymond O. Zenker, Whittier, and Bobby G. Durant, Westminster, Calif., assignors to Sola Basic Industries Filed Mar. 14, 1966, Ser. No. 533,998
Int. Cl. B23k *1/06*
U.S. Cl. 228—1 4 Claims

ABSTRACT OF THE DISCLOSURE

Apparatus for bonding a semiconductor die to a mounting member which imparts a horizontal oscillating movement to the die and simultaneously holds the die in contact with the mounting member so that a gold eutectic bond is promoted between the die and mounting member. Various mechanical horizontal drive oscillators are disclosed.

This invention relates to apparatus for effecting bonding of parts to partially-completed semiconductor devices. In particular, the invention relates to apparatus for transporting and bonding semiconductor dies to such devices by forming a eutectic bond between the die and the semiconductor device.

Heretofore, bonds which join a semiconductor die to a mounting member have been of three types. In the first type, the die is prepared by applying metallic gold to one surface thereof and heat-treating the die to form a partial eutectic of the gold with the semiconductor metal. The die so prepared is then contacted with a mounting member such as a partially-assembled header device having a surface prepared for gold plate bonding and the two parts are bonded under heat and pressure at or above the eutectic temperature. This type of bond usually forms without additional agitation of the die depending upon the success achieved in formation of the initial eutectic before the members were joined. This method has not found general favor in the art because of required additional heat treatment.

A second method used for die bonding involves application of a preformed piece of suitable alloy material between the semiconductor die and the prepared surface of a mounting member. If the alloy is a eutectic alloy of the members to be joined, it is not necessary to form such eutectic alloy on the semiconductor die itself. It is, however, necessary either to prevent oxidation as the preformed alloy is melted, or to break through the oxide layer formation by some means of agitation to achieve a good bond. If the alloy is essentially gold with or without trace impurities, it is necessary to create the eutectic of gold and the semiconductor metal by some agitation means. In this second method, the preformed alloy is usually used to introduce a trace impurity to the system of metals comprising a semiconductor device for reasons pertinent to manufacture of the device itself.

In the third die bonding method and the one used in this invention, the die is joined directly to mounting member having a previously prepared surface, usually gold-coated, which forms a eutectic in situ with the die. The bond to be created is not formed by heat and pressure alone but rather requires further mechanical agitation of the die to initiate and promote the formation of the eutectic alloy. In the past, this agitation has been supplied manually by an operator skilled in moving the semiconductor die about the mounting surface. This operation requires a high degree of skill of the operator to put the die in tweezers, applying manually the bonding force and the agitation. The only machine function is to furnish the proper temperature of the mounting member. Bonding machines known in the art which have attempted to create bonds of this type have been unsuccessful because they have not supplied the proper relative movement between the two parts of the assembly. Such relative movement was attempted by a vibrator mechanically actuated by alternating current, characteristically with small amplitude of oscillatory movement which is totally inadequate to create and promote the eutectic bond.

It is thus an object of this invention to provide an apparatus for bonding semiconductor dies to partially-completed headers by promoting formation of eutectic bond through relative motion of the parts under precise machine control.

It is a further object of this invention to provide an apparatus for die bonding by which the force applied to the die to effect bonding is precisely controlled and forms uniform bonds regardless of the skill of a machine operator.

It is yet another object of this invention to provide an apparatus for picking up and transporting a semiconductor die from a pick-up station to a work station at which die bonding is effected.

It is another object of this invention to provide an apparatus whereby a semiconductor die can be bonded to a partially-completed header device without damaging either the die or the header.

Other objects of the invention will become apparent as it is more fully described hereinafter.

Essentially, the apparatus of our invention comprises a novel needle pick-up means by which semiconductor dies can be picked up and transported to a work station at which the die is contacted with a partially-completed header for bonding thereto. The bonding needle assembly includes means by which the needle may be oscillated laterally under relatively large amplitude to effect a scrubbing action between the parts which aids in formation of a good eutectic bond.

Figure 1:
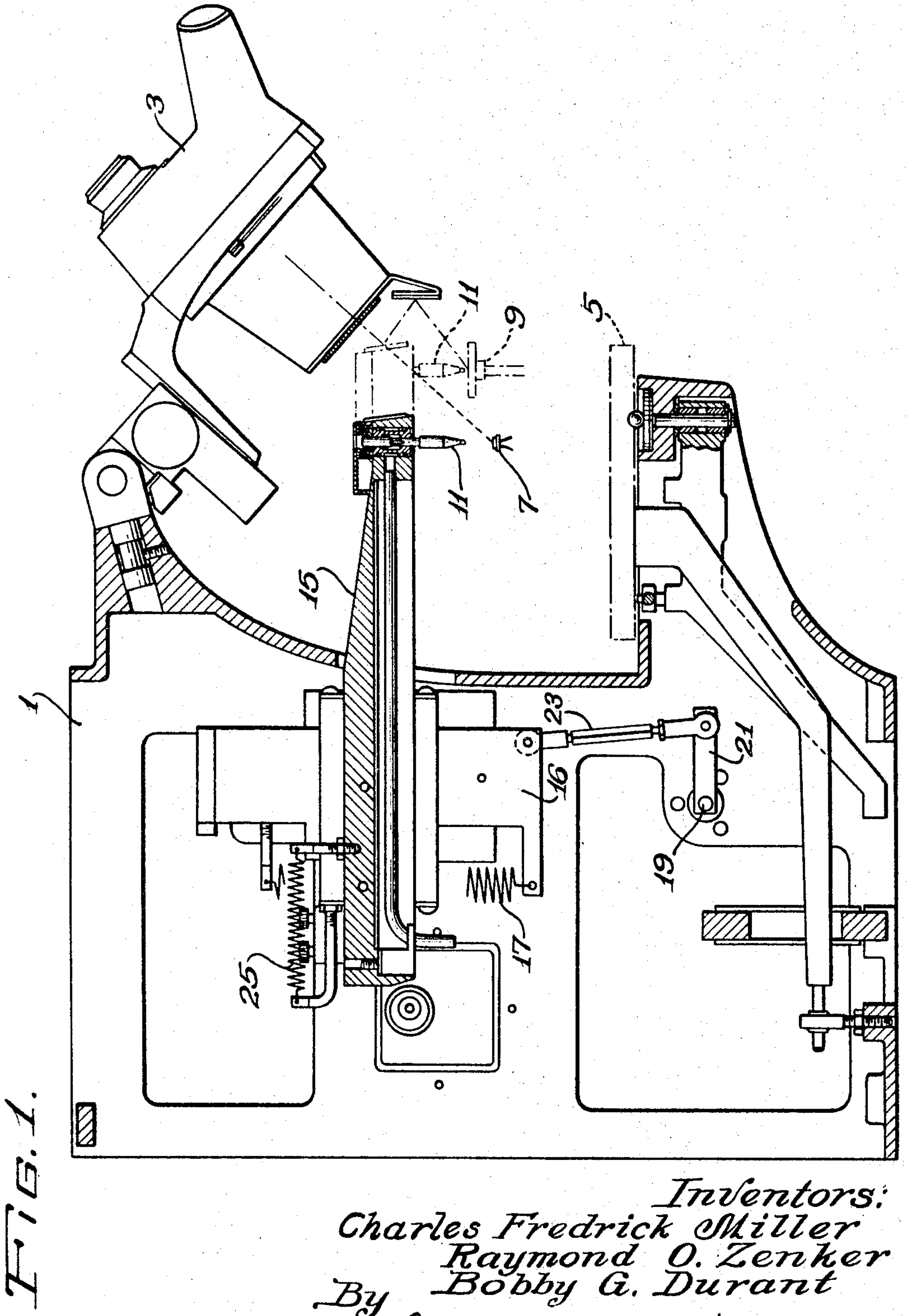
FIG. 1 is a side elevation of a machine including one embodiment of the apparatus of the invention.

Referring to FIG. 1, there is shown one embodiment of a bonding machine which may be used in conjunction with the apparatus of this invention. The machine comprises basically a frame 1 to which is attached a microscopic sighting means 3. Also supported by frame 1 is a mounting plate 5 which is horizontally movable by means of a manually operable micromanipulator device described in my copending application Ser. No. 533,997, filed Mar. 14, 1966. Mounting plate 5 supports a work station assembly (not shown) which in turn supports work pieces, one of which is shown diagrammatically at 7 in position for the bonding operation. Mounting plate 5 also supports a die cup shown diagrammatically at 9 which contains dies to be picked up by bonding head 11 for transport to work station 7. As is evident from the above description, both the work station assembly and the die cup 9 may be moved on plate 5 for positioning under bonding head 11.

Bonding and pick-up needle 13 is supported by bonding head 11 as described hereinafter and head 11 is in turn supported by arm assembly 15 which is movably secured to frame 1. Support arm 15 is movable between a retracted and an extended position as shown in FIG. 1 by means of a cam arrangement (not shown) which retracts or extends arm 15 so that bonding head 11 is either in the bonding position or the die pick-up position. Suitable actuation means are provided so that the machine operator may select either position. Support arm 15 is raised and lowered in conjunction with support block 16 against tension spring 17 by means of rotatable shaft 19 which is connected by link 23 to a control arm 21. Support arm 15 is spring biased by spring 25 which tends to hold arm 15 in the retracted position.

The overall operation of the machine and its parts, although not per se a part of this invention, will be briefly described. When a work piece is positioned at 7 and is prepared for bonding, the machine operator causes arm 15 to be extended so that needle 13 is above die cup 9. By means of the micro manipulator described in the copending application noted above and the novel sighting means 3, described in copending application Ser. No. 534,245, filed Mar. 14, 1966, a die is picked up at 9 and transported to work piece 7 where it is contacted and bonded as more fully described hereinafter. The force system by which the die is held to the needle and by which the needle is contacted with the work piece is described in copending application Ser. No. 437,980, filed Mar. 8, 1965, now U.S. Patent No. 3,342,396. Basically, it comprises a vacuum system wherein the bonding force is supplied in a low inertia system and vertical pulsations of the needle are effected by means of an electromagnetic vibrator.

Figure 2:
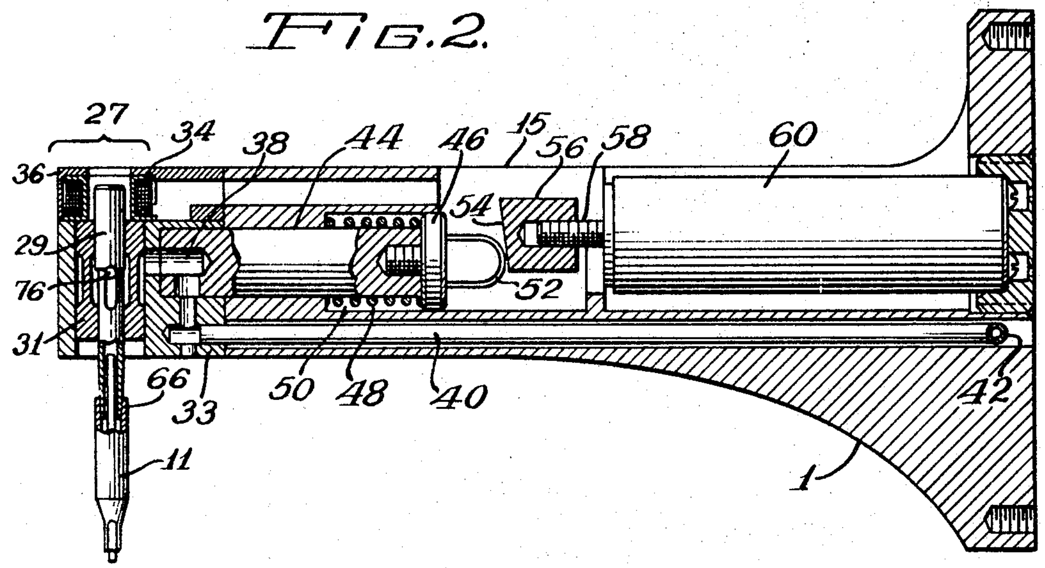
FIG. 2 is an exploded side view in section of one embodiment of the lateral vibrating means of the invention.

Turning now to the specific apparatus of the invention, FIG. 2 shows one embodiment of the bonding needle support arm and the means by which the bonding needle is oscillated to effect lateral scrubbing of the die as it is bonded to the header device. Referring to FIG. 2, frame 1 contains a force system shown generally at 27 and described in copending application Ser. No. 437,980, filed Mar. 8, 1965, now U.S. Patent No. 3,342,396. Basically, it consists of a spindle 29 mounted in an air bearing 31 which is fitted by pressing into the nose piece 33 of frame 1. Around the upper part of spindle 29 is positioned an electro magnetic coil 34 enclosed by cap 36 which acts through the application of alternating current to produce force pulsations subtracting from the basic force generated by regulated vacuum acting upon differential areas of spindle 29 as described in the above-mentioned application. Vacuum is ported to this force system through port 38 communicating with tube 40 to a connection point 42. Vacuum is supplied and regulated by means not shown.

Nose piece 33 is adapted to slide with respect to frame 1 by movement of cylindrical surface 44 in the corresponding bore of frame 1. It is constrained from rotating about the axis of cylindrical surface 44 by engagement of a tongue member (not shown) in nose piece 33 sliding in a corresponding groove (not shown) of frame 1. Attached to the end of cylindrical member 44 is a cap member 46 with a flange serving to compress spring 48 in the counter bore 50 of frame 1.

Cap 46 has a projection with spherical surface 52 which contacts the face 54 of a wobble plate cam member 56. Cam 56 is secured to shaft 58 of electric motor 60. Operation of motor 60 causes rotation of wobble-type cam 56 which imparts linear harmonic motion to the follower spherical surface 52, then through members 46 and 44, 33 and 31 transmits linear harmonic motion to spindle 29. Spring 48 maintains engagement of the follower spherical surface 52 with cam surface 54.

The amplitude of motion of spindle 29 is determined by the angularity of cam surface 54 with respect to the axis of cam 56, and this amplitude may be changed by substituting different members 56 having varying angularity.

Figure 3:
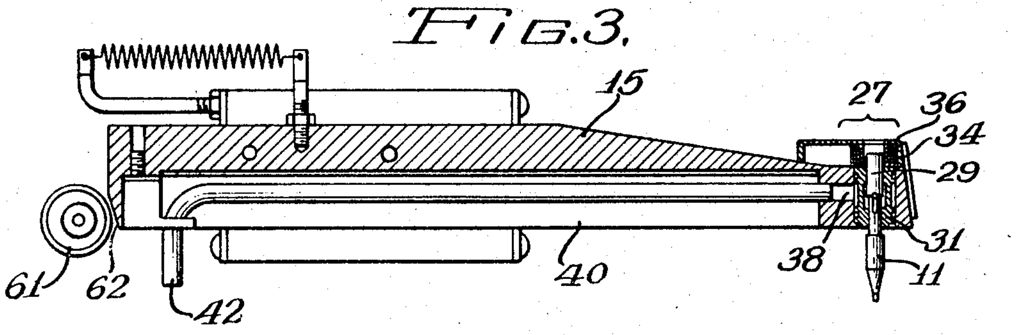
FIG. 3 is a side view in section of another embodiment of the lateral vibrating means of the invention.

In the embodiment shown in FIG. 3, the scrubbing action of the bonding needle is provided by oscillating the entire bonding needle support arm 15 by means of a cam 61 which is rotated eccentrically and contacts the back surface 62 of the support arm when brought into position above the near tangent plane of eccentric cam 61. Cam 61 is attached to the shaft of a motor (not shown) and consists preferably of a thin ball bearing mounted eccentrically on said shaft. Cam 61 may be adjusted on the motor shaft to vary the degree of eccentricity and thus the amplitude of movement of the support arm.

Figure 4:
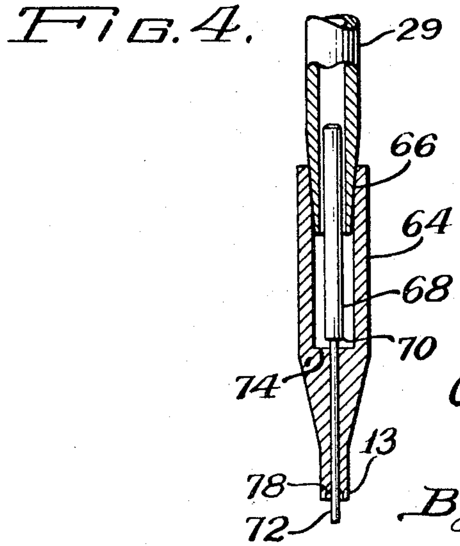
FIG. 4 is an exploded side view in section of one embodiment of the novel bonding needle and die pick-up means of the invention.

Harmonic motion imparted to spindle 29 as described above is transmitted to the semiconductor die bonding head 11 which engages spindle 29 by taper attachment as shown at 66. One embodiment of a bonding head useful in the invention is shown in FIG. 4 and contains a pin 68 having a region of smaller diameter extending beyond shoulder 70 to project outside the end of the needle 64 at point 72. Normally, pin 68 is at rest upon shoulder 70 thereby abutting needle 64 at 74. When vacuum is admitted to attract a die, pin 68 is lifted within the bore of spindle 29 until it engages a cross stop pin 76 (FIG. 2) of force system 27. In this condition, the small diameter area of pin 68 is yet an engagement with its corresponding bore of needle 64. Needle 64 is provided at its lower end with slanted gripping surfaces 78 (best seen in FIGS. 5 and 6) which grip a die and hold it during the scrubbing operation as hereinafter described. The cross sectional shape of that portion of needle 64 with the gripping surfaces is the same as the shape of the die which is to be picked up by the gripping surfaces. In this way the die is held securely into the tip of the needle.

Figures 5, 9:
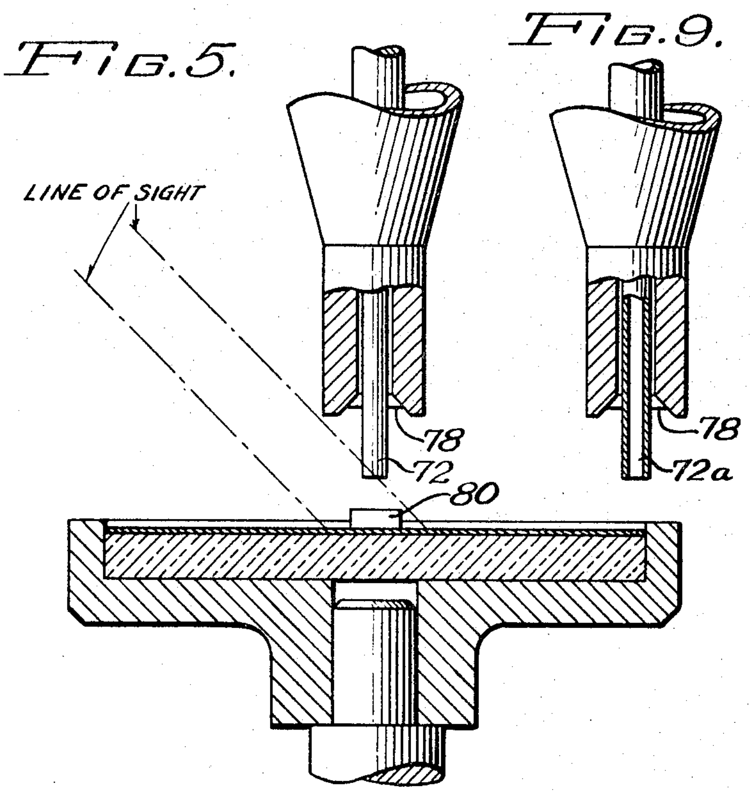
FIG. 5 is a side view illustrating one method of picking up a die for transporting to a work station.
FIG. 9 is a side view showing another alternative method of picking up and supporting a die.
Figure 6:
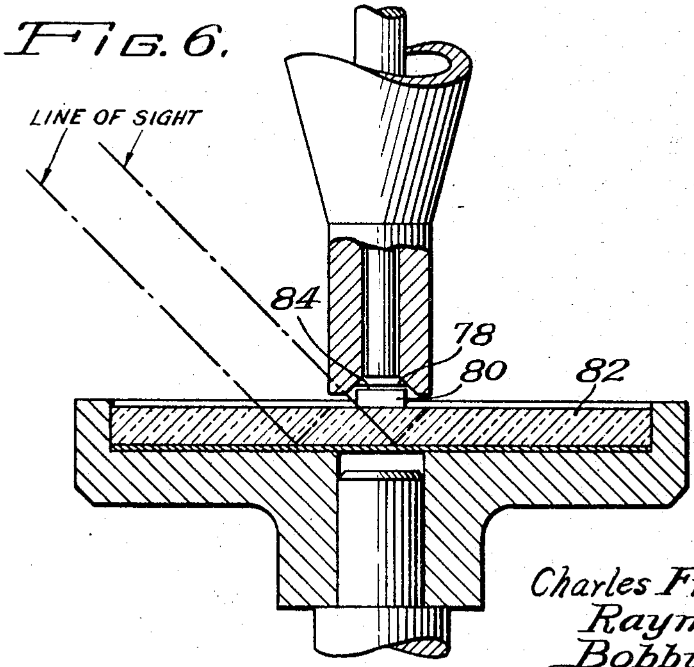
FIG. 6 is a side view showing an alternative method of picking up and supporting a die.

In operation, the projecting portion 72 of pin 68 serves as an alignment target by which to position a pattern area of a semiconductor die. This projecting point 72 is visible within the line of sight and alignment of the pattern area, or even of the overall outline of the semiconductor die. Motion to accomplish this alignment is best seen as shown in FIG. 5. When the alignment is complete, needle 64 is caused to descend by lowering the support arm assembly to bring the gripping surfaces 78 into engagement with the semiconductor die 80 as best seen in FIG. 6. The scrubbing action is then imparted to the die at the work piece through tapered surfaces 78 which hold the die securely from lateral slippage as the needle is oscillated horizontally.

An alternative method of aligning the die into the position to engage the gripping surfaces of the needle is shown in FIG. 6. In the alternative method, semiconductor dies are arranged for pick-up upon a mirror 82. The line of sight from the microscope passes through the mirror material and is reflected from the second surface to view the underside of the die 80 and the face of pick-up needle 64. By viewing this bottom surface, it can be determined when alignment is correct so that the edges of die 80 will be engaged by surfaces 78 of the pick-up needle. However, movement of the machine control elements to effect this alignment must be executed, after consideration of the reversial of the line of sight.

In operation of the die pick-up using the needle as shown in FIG. 5 pin extension 72 is brought into alignment with die 80 through operation of the machine control elements. Machine controls are then operated to cause spindle 29 and needle 64 to descend to contact die 80. During the descent, pin 72 rests upon the semiconductor die and moves upward within needle 64 and spindle 29. When surfaces 78 of needle 64 contact die 80, air bearing 31 of force system 27 travels freely along with spindle 29 leaving engagement of its stop pin 76. The machine control manually operated by the machine operator moves to such position that vacuum is signalled on by limit switch means not shown. Vacuum then builds up force to the preset level, attracts the die through needle 64, and further retracts pin 68 until the pin abuts stop pin 76. Vacuum is admitted through the various ports of the assembly to act upon the upward end of pin 68. Lifting force is maintained on pin 68 by leakage of air through areas 84 (FIG. 6) communicating to atmosphere through the edges of the wedge-shaped needle. There is maintained across area 84 a pressure sufficiently reduced to maintain attraction of die 80.

Figure 8:
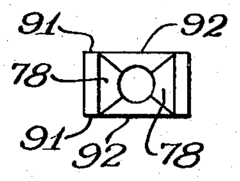
FIG. 8 is an end view of the novel bonding needle.

FIGURE 8 is an end view of needle 64 which clarifies the shape of the cavity. This cavity is produced by forging into the end of the needle a tool having pyramid shape. The impression of this shape provides the wedge surfaces 78 which contact the die. The sides of the needle are machined away at surfaces 91 to a total width less than the width of the die so that edges 92 do not contact the surface of die 80. The elevation of these edges 92 above the surface of die 80 provides the openings 84 to pass air to the vacuum system as described. Edges 92 and areas 84 are shown in FIGURE 6.

A variation of the pickup method shown in FIGURE 5, which uses pin 72 as a target means, is the method shown in FIGURE 9 in which pin member 72 is hollow, providing passage **72*a* communicating to vacuum. This vacuum passage 72*a* provides that the semiconductor die 80 may be attracted to the pin member 72 and that the die 80 may then be lifted into engagement with wedge surface 78 of the needle 64 as vacuum acts to lift pin member 68 as previously described. This action provides a significant added capability to attract and lift a die from an array of closely spaced dice. For this operation vacuum is signalled on during descent of this pickup means at a point after pin 72 has contacted die 80 but before needle 64** has yet descended to the level of the dice.

After a die has been picked up by the needle, the needle is moved into position for bonding of the die with the semiconductor header. The amplitude of scrubbing utilized during the bonding operation is not critical but preferably is about one-half of the dimension of the semiconductor die in the direction of movement. Frequency of this cyclic movement is preferably about five strokes per second and is executed as harmonic motion for efficient and smooth machine operation. Optimum amplitude and frequency of vibration to effect a good eutectic bond will depend upon the die size, the temperature of the header, etc., and can be determined at the time of operation.

Figure 7:
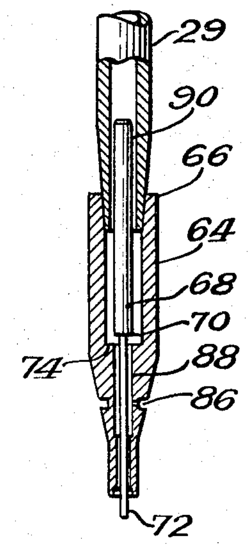
FIG. 7 is an exploded side view showing an alternative embodiment of the novel needle and pick-up means of the invention.

FIG. 7 shows an alternative embodiment of a needle for use with this invention. When using very small needles with very small dies, it is necessary to provide an additional air leak path for supporting pin 68 in needle and spindle housing 64 and 29. This is necessary since in using very small dies, there is insufficient leakage at point 84 (FIG. 6) to maintain sufficient gas flow to support pin 68. As shown in FIG. 7, needle 64 is thus provided with a vent hole 86 which is drilled into one side of the needle as shown in FIG. 7. The passage of hole 86 communicates with annular space 88 and allows passage of atmospheric air around pin 68 to annular area 90. Annular space 88 is proportioned with adequate clearance to allow flow while space 90 is proportioned as a relatively close fit. Air in passing through annular space 90 drops to the pressure of the vacuum maintained in the air bearing 31. The drop in pressure across area 90 acts as a pressure difference upon the area of shoulder 70 to create lift on pin 68. Downward rest position of pin 68 is determined by the abutment of shoulder 70 at point 74. The upward limit of movement is determined by abutment of pin 68 against stop pin 76 (FIG. 2). The operation with the needle shown in FIG. 7 is similar to that previously described in that pin 68 is aligned and then brought to bear on the pattern of a semiconductor device and vacuum is then admitted to lift pin 68 by the action described and to attract the die as before. Die attraction is maintained by vacuum communicated along the fit of pin 68. The vacuum is of a low order because the fit of pin 68 is necessarily closer as this pin becomes smaller. Passage of air through this fit is sufficient to maintain vacuum to attract the die, but is not sufficient to lift the mass of pin 68 without the additional vent passage created by addition of hole 86.

Those skilled in the art will recognize that various modifications can be made to the invention within the scope thereof which we intend to be limited solely by the appended claims.

We claim:

1. Apparatus for transporting and bonding semiconductor parts comprising a frame, a bonding needle assembly movable for selective positioning at a first and second work station, means on said frame for supporting said bonding needle assembly, means including a hollow bonding needle for picking up a semiconductor work piece under vacuum at said first work station and means for horizontally vibrating said bonding needle assembly at said second work station, said vibrating means comprising a rotatable eccentric cam, means for rotating said cam, and a cam follower communicating with said cam and said bonding needle assembly for lateral oscillation movement of said bonding needle assembly in response to rotation of said cam.

2. Apparatus of claim 1 wherein said bonding needle comprises a vertically disposed hollow shaft, an elongated pin disposed concentrically in said shaft and having one end protruding out of the lower end of said shaft, said pin being movable along the longitudinal axis of said shaft in response to air pressure change in said shaft, and said shaft having a recess at its lower end for accommodating a semiconductor part.

3. Apparatus of claim 2 wherein said needle is vented to atmosphere by means of an aperture in said shaft.

4. Apparatus of claim 2 wherein the cross sectional shape of said recess is substantially identical to said semiconductor part to be accommodated therein.

References Cited

UNITED STATES PATENTS 3,357,090 12/1967 Tiffany ------------ 29—497.5

RICHARD H. EANES, Jr., *Primary Examiner.*